United States Patent
Kim

(10) Patent No.: US 11,121,347 B2
(45) Date of Patent: Sep. 14, 2021

(54) DISPLAY APPARATUS HAVING AN ENCAPSULATION SUBSTRATE OF HIGH THERMAL CONDUCTIVITY

(71) Applicant: LG Display Co., Ltd., Seoul (KR)

(72) Inventor: Jung-Mook Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/537,716

(22) Filed: Aug. 12, 2019

(65) Prior Publication Data
US 2020/0058894 A1 Feb. 20, 2020

(30) Foreign Application Priority Data
Aug. 17, 2018 (KR) .......................... 10-2018-0096176

(51) Int. Cl.
*H01L 51/52* (2006.01)
*H01L 27/32* (2006.01)

(52) U.S. Cl.
CPC ........ *H01L 51/529* (2013.01); *H01L 27/3244* (2013.01); *H01L 51/5253* (2013.01); *H01L 51/5259* (2013.01); *H01L 2251/301* (2013.01)

(58) Field of Classification Search
CPC ............... H01L 51/529; H01L 27/3244; H01L 51/5259; H01L 51/5253; H01L 2251/301; H01L 51/5256
See application file for complete search history.

(56) References Cited

U.S. PATENT DOCUMENTS

| | | | |
|---|---|---|---|
| 2005/0194896 A1* | 9/2005 | Sugita | B82Y 30/00 313/506 |
| 2010/0028559 A1* | 2/2010 | Yan | H01F 1/0054 427/558 |
| 2010/0247960 A1* | 9/2010 | Qiu | G11B 5/855 428/800 |
| 2012/0037840 A1* | 2/2012 | Stucky | B01J 20/103 252/62.53 |
| 2012/0256556 A1* | 10/2012 | Omoto | G09G 3/30 315/240 |
| 2014/0034918 A1* | 2/2014 | Choung | H01L 51/56 257/40 |
| 2014/0146279 A1* | 5/2014 | Kim | G02B 1/14 349/122 |
| 2014/0183462 A1* | 7/2014 | Lee | H01L 51/5253 257/40 |
| 2016/0049443 A1* | 2/2016 | Kim | H01L 51/56 257/91 |
| 2016/0118612 A1* | 4/2016 | Park | H01L 51/5278 257/40 |
| 2017/0110681 A1* | 4/2017 | Shen | H01L 27/3258 |

(Continued)

*Primary Examiner* — Bitew A Dinke
(74) *Attorney, Agent, or Firm* — Polsinelli PC

(57) ABSTRACT

A display apparatus comprises a light-emitting device on a device substrate; an encapsulating layer on the device substrate and covering the light-emitting device; an encapsulation substrate on the encapsulating layer and including a plurality of penetrating holes disposed at a regular interval; and a moisture-blocking layer between the encapsulating layer and the encapsulation substrate and including a plurality of moisture-absorbing particles dispersed in the encapsulating layer, wherein the moisture-blocking layer has a water vapor transmission rate lower than that of the encapsulating layer.

20 Claims, 5 Drawing Sheets

(56) References Cited

U.S. PATENT DOCUMENTS

| | | | |
|---|---|---|---|
| 2017/0222182 A1* | 8/2017 | Mo | H01L 51/5268 |
| 2017/0316855 A1* | 11/2017 | Deligianni | G09G 3/3275 |
| 2017/0345880 A1* | 11/2017 | Kim | A61K 31/7068 |
| 2018/0097204 A1* | 4/2018 | Ivan | H01L 51/56 |
| 2018/0149872 A1* | 5/2018 | Choi | G02B 5/0242 |
| 2018/0151648 A1* | 5/2018 | Kim | H01L 27/3246 |
| 2018/0314067 A1* | 11/2018 | Cho | H01L 51/5262 |
| 2019/0067641 A1* | 2/2019 | Shin | H01L 51/5012 |
| 2019/0103579 A1* | 4/2019 | Kim | H01L 51/5246 |
| 2019/0221767 A1* | 7/2019 | Lee | H01L 51/5284 |
| 2019/0319075 A1* | 10/2019 | Lee | H01L 27/322 |

* cited by examiner

DISPLAY APPARATUS HAVING AN ENCAPSULATION SUBSTRATE OF HIGH THERMAL CONDUCTIVITY

CROSS REFERENCE TO RELATED APPLICATION

This application claims the priority benefit of Korean Patent Application No. 10-2018-0096176 filed on Aug. 17, 2018, which is hereby incorporated by reference in its entirety.

BACKGROUND

Field of the Disclosure

The present disclosure relates to a display apparatus, and more particularly, to a display apparatus in which an encapsulation substrate of high thermal conductivity for high heat radiation efficiency.

Description of the Background

Generally, an electronic appliance, such as a monitor, a TV, a laptop computer and a digital camera, includes a display apparatus to realize an image. For example, the display apparatus may include a light-emitting device. The light-emitting device may generate light display a specific color. For example, the light-emitting device may include a first electrode, a light-emitting layer and a second electrode, which are sequentially stacked.

The light-emitting layer may be very vulnerable to moisture. Thus, the display apparatus may have a structure for preventing permeation of external moisture. For example, the display apparatus may include an encapsulating layer covering the light-emitting device and an encapsulation substrate on the encapsulating layer. The encapsulation substrate may be coupled with a device substrate in which the light-emitting device is formed.

In an operation of displaying an image, heat may be generated by the light-emitting device and/or a driving circuit for controlling the light-emitting device. The light-emitting layer may be deteriorated by the heat generated by the light-emitting device or the driving circuit. Thus, the display apparatus may have a structure with high heat radiation efficiency. For example, in the display apparatus, the encapsulation substrate may include a material having a relatively high thermal conductivity, such as metal.

However, since the material having a relatively high thermal conductivity may have high thermal expansion coefficient, the encapsulation substrate of the display apparatus may be warped due to the thermal expansion by the heat applied in a forming process or the external heat. Thus, in the display apparatus, the lifetime may be reduced due to the warpage of the encapsulation substrate.

SUMMARY

Accordingly, the present disclosure is directed to a display apparatus that substantially obviates one or more problems due to limitations and disadvantages of the related art.

The present disclosure provides a display apparatus having high heat radiation efficiency and capable of preventing the warpage of the encapsulation substrate due to external heat.

The present disclosure provides a display apparatus capable of minimizing deterioration of the light-emitting device due to a structure for preventing the warpage of the encapsulation substrate.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these aspects and other advantages and in accordance with the purpose of the disclosure, as embodied and broadly described herein, there is provided a display apparatus including a light-emitting device and an encapsulating layer on a device substrate. The light-emitting device is covered by the encapsulating layer. An encapsulation substrate is disposed on the encapsulating layer. The encapsulation substrate includes a plurality of penetrating holes. A first moisture-blocking layer is disposed between the encapsulating layer and the encapsulation substrate. The water vapor transmission rate of the first moisture-blocking layer is lower than the water vapor transmission rate of the encapsulating layer.

The encapsulation substrate may include metal.

The first moisture-blocking layer and the encapsulating layer may include an organic insulating material.

A second moisture-blocking layer may be disposed between the first moisture-blocking layer and the encapsulation substrate. The encapsulation substrate may include an inorganic insulating material.

The size of the penetrating holes per unit area may be less than 2 min.

The penetrating holes may be disposed at regular intervals.

A distance between the penetrating holes may be 6 mm or more.

A side surface of the encapsulation substrate may be disposed between a side surface of the device substrate and a side surface of the first moisture-blocking layer. The distance between the penetrating holes may be larger than a distance between the side surface of the encapsulation substrate and the penetrating hole which is disposed closest to the side surface of the encapsulation substrate.

A distance between the penetrating holes disposed closest to the side surface of the encapsulation substrate and the side surface of the first moisture-blocking layer may be the same as the distance between the penetrating holes.

In another aspect, the display apparatus includes an encapsulating layer between a device substrate and an encapsulation substrate. The encapsulating layer includes moisture-absorbing particles. A light-emitting device is disposed between the device substrate and the encapsulating layer. A first moisture-blocking layer is disposed between the encapsulating layer and the encapsulation substrate. The encapsulation substrate includes a plurality of penetrating holes overlapping with the first moisture-blocking layer.

The penetrating holes may be disposed at regular intervals in a first direction. The penetrating holes adjacent in a second direction perpendicular to the first direction may be staggered.

The first moisture-blocking layer may include magnetic material.

The magnetic material may include one of iron (Fe), nickel (Ni) and cobalt (Co).

A second moisture-blocking layer may be disposed between the first moisture-blocking layer and the encapsulation substrate. The second moisture-blocking layer may include an insulating material having the water vapor transmission rate lower than the encapsulating layer.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
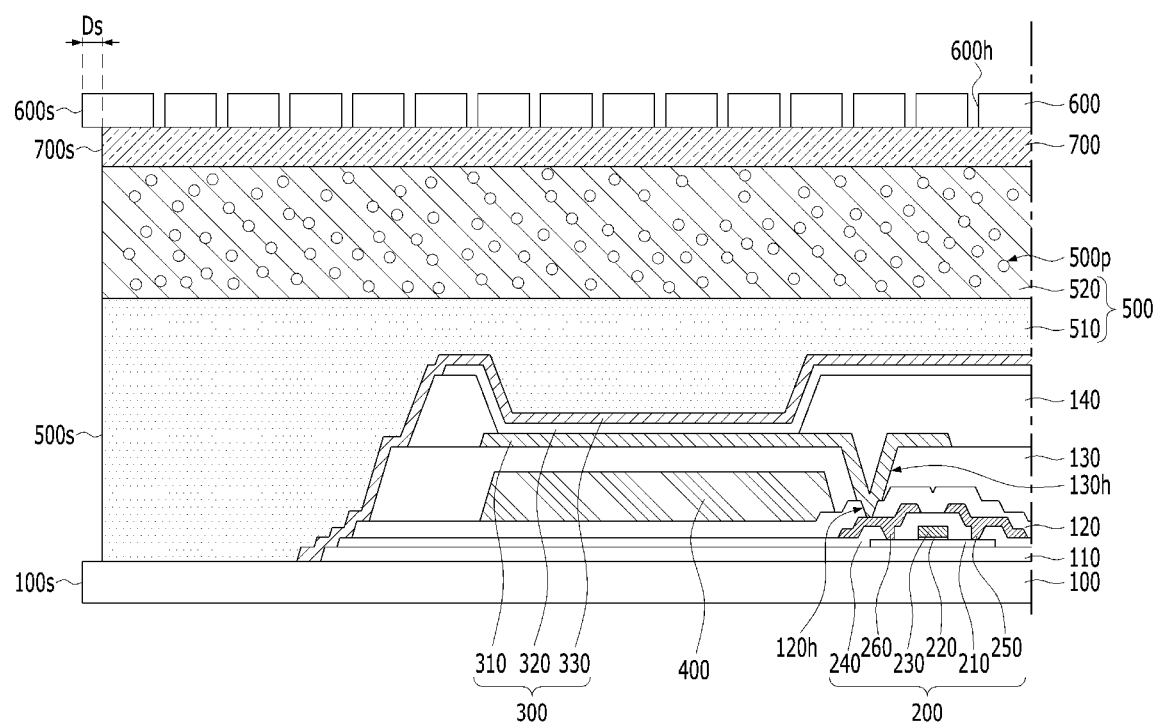
FIG. 1 is a view schematically showing a display apparatus according to an aspect of the present disclosure.

Hereinafter, details related to the above aspects, technical configurations, and operational effects of the aspects of the present disclosure will be clearly understood by the following detailed description with reference to the drawings, which illustrate some aspects of the present disclosure. Here, the aspects of the present disclosure are provided in order to allow the technical sprit of the present disclosure to be satisfactorily transferred to those skilled in the art, and thus the present disclosure may be embodied in other forms and is not limited to the aspects described below.

In addition, the same or extremely similar elements may be designated by the same reference numerals throughout the specification and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular aspects, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 2:
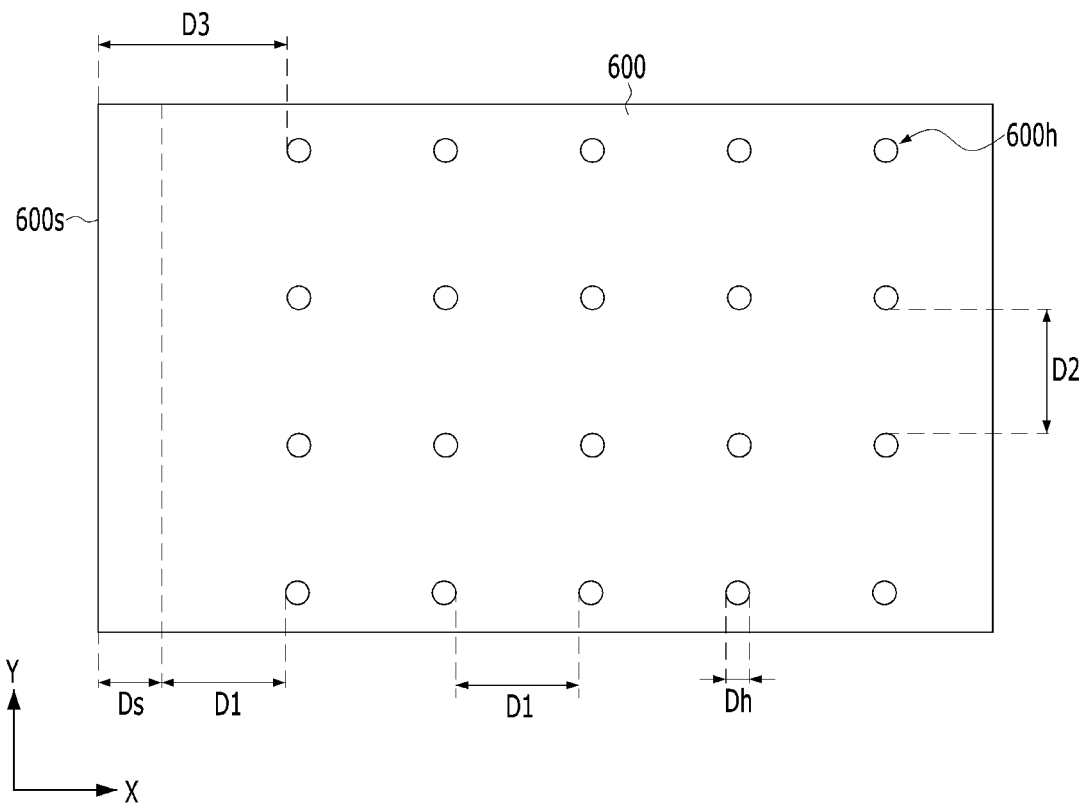
FIG. 2 is a view partially showing an upper surface of an encapsulation substrate of the display apparatus according to the present disclosure.

FIG. 1 is a view schematically showing a display apparatus according to an aspect of the present disclosure. FIG. 2 is a view partially showing an upper surface of an encapsulation substrate of the display apparatus.

Referring to FIGS. 1 and 2, the display apparatus according to the aspect of the present disclosure may include a device substrate 100. The device substrate 100 may include an insulating material. The device substrate 100 may include a transparent material. For example, the device substrate 100 may include glass or plastic.

A light-emitting device 300 may be disposed on the device substrate 100. The light-emitting device 300 may emit light realizing a specific color. For example, the light-emitting device 300 may include a first electrode 310, a light-emitting layer 320 and a second electrode 330, which are sequentially stacked.

The first electrode 310 may include a conductive material. The first electrode 310 may include a transparent material. For example, the first electrode 310 may be a transparent electrode formed of a transparent conductive material, such as ITO and IZO.

The light-emitting layer 320 may generate light having luminance corresponding to a voltage difference between the first electrode 310 and the second electrode 330. For example, the light-emitting layer include an emission material layer (EML) having an emission material. The emission material may include an organic material, an inorganic material or a hybrid material. For example, the display apparatus according to the aspect of the present disclosure may be an organic light-emitting display apparatus having the light-emitting layer formed of the organic material.

The light-emitting layer 320 may have a multi-layer structure in order to increase luminous efficacy. For example, the light-emitting layer 320 may further include at least one of a hole injection layer (HIL), a hole transporting layer (HTL), an electron transporting layer (ETL) and an electron injection layer (EIL).

The second electrode 320 may include a conductive material. The second electrode 320 may include a material different from the first electrode 310. For example, the second electrode 320 may include a metal having high reflectance such as aluminum (Al). Thus, in the display apparatus according to the aspect of the present disclosure, the light generated by the light-emitting layer 320 may be emitted to outside through the first electrode 310 and the device substrate 100.

A driving circuit may be disposed between the device substrate 100 and the light-emitting device 300. The driving circuit may supply a driving current corresponding to a data signal applied through a data line according to a gate signal applied through a gate line. The driving circuit may include at least one thin film transistor 200 and a storage capacitor. For example, the first electrode 310 of the light-emitting device 300 may be electrically connected to the thin film transistor 200 of the corresponding driving circuit.

The thin film transistor 200 may control the operation of the light-emitting device 300. For example, the thin film transistor 200 may include a semiconductor pattern 210, a gate insulating layer 220, a gate electrode 230, an interlayer insulating layer 240, a source electrode 250 and a drain electrode 260. The light-emitting device 300 may be connected to the drain electrode 260 of the corresponding thin film transistor 200.

The semiconductor pattern 210 may be disposed close to the device substrate 100. The semiconductor pattern 210 may include a semiconductor material. For example, the semiconductor pattern 210 may include amorphous silicon or poly-silicon. The semiconductor pattern 210 may be an oxide semiconductor. For example, the semiconductor pattern 210 may include IGZO.

The semiconductor pattern 210 may include a source region, a drain region and a channel region. The channel region may be disposed between the source region and the drain region. The channel region may have electrical conductivity lower than the source region and the drain region. For example, the source region and the drain region may have a concentration of the conductive impurity higher than the channel region.

The gate insulating layer 220 may be disposed between the semiconductor pattern 210 and the light-emitting device 300. For example, the semiconductor pattern 210 may be disposed between the device substrate 100 and the gate insulating layer 220. The gate insulating layer 220 may expose an upper surface of a portion of the semiconductor pattern 210 toward the light-emitting device 300. For example, the gate insulating layer 220 may overlap with the channel region of the semiconductor pattern 210. The source region and the drain region of the semiconductor pattern 210 may be not covered by the gate insulating layer 220.

The gate insulating layer 220 may include an insulating material. For example, the gate insulating layer 220 may include silicon oxide and/or silicon nitride. The gate insulating layer 220 may have a multi-layer structure. The gate insulating layer 220 may include a high-K material. For example, the gate insulating layer 220 may include hafnium oxide (HfO) or titanium oxide (TiO).

The gate electrode 230 may be disposed on the gate insulating layer 220. For example, the gate insulating layer 220 may be disposed between the semiconductor pattern 210 and the gate electrode 230. The gate electrode 230 may be insulated from the semiconductor pattern 210 by the gate insulating layer 220. The gate electrode 230 may be overlap with the channel region of the semiconductor pattern 210.

The gate electrode 230 may include a conductive material. For example, the gate electrode 230 may include a metal, such as aluminum (Al), chrome (Cr), molybdenum (Mo) and tungsten (W).

The interlayer insulating layer 240 may cover the semiconductor pattern 210 and the gate electrode 230. The interlayer insulating layer 240 may be extended beyond the semiconductor pattern 210. For example, a side surface of the semiconductor pattern 210 may be covered by the interlayer insulating layer 240. The interlayer insulating layer 240 may include an insulating material. For example, the interlayer insulating layer 240 may include silicon oxide.

The source electrode 250 and the drain electrode 260 may be disposed between the interlayer insulating layer 240 and the light-emitting device 300. The source electrode 250 may be electrically connected to the source region of the semiconductor pattern 210. The drain electrode 260 may be electrically connected to the drain region of the semiconductor pattern 210. The drain electrode 260 may be spaced away from the source electrode 250. For example, the interlayer insulating layer 240 may include a source contact hole partially exposing the source region of the semiconductor pattern 210, and a drain contact hole partially exposing the drain region of the semiconductor pattern 210.

The source electrode 250 and the drain electrode 260 may include a conductive material. For example, the source electrode 250 and the drain electrode 260 may include a metal, such as aluminum (Al), chrome (Cr), molybdenum (Mo) and tungsten (W). The drain electrode 260 may include a material same as the source electrode 250. For example, the drain electrode 260 may be simultaneously formed with the source electrode 250. The gate electrode 230 may include a material different from the source electrode 250 and the drain electrode 260.

A buffer layer 110 may be disposed between the device substrate 100 and the thin film transistor 200. For example, the buffer layer 110 may be disposed between the device substrate 100 and the semiconductor pattern 210. The buffer layer 110 may be extended beyond the semiconductor patter 210. For example, the buffer layer 110 may be in contact with the interlayer insulating layer 240 at the outside of the semiconductor pattern 210. The buffer layer 110 may include an insulating material. For example, the buffer layer 110 may include silicon oxide.

A lower passivation layer 120 may be disposed between the thin film transistor 200 and the light-emitting device 300. The lower passivation layer 120 may prevent the damage of the thin film transistor 200 due to external impact and moisture. For example, the lower passivation layer 120 may be extended beyond the source electrode 250 and the drain electrode 260. The thin film transistor 200 may be covered by the lower passivation layer 120, completely. The lower passivation layer 120 may include an insulating material. The lower passivation layer 120 may include an inorganic material. For example, the lower passivation layer 120 may include silicon nitride.

An over-coat layer 130 may be disposed between the lower passivation layer 120 and the light-emitting device 300. The over-coat layer 130 may extend along the lower passivation layer 120. The over-coat layer 130 may remove a thickness difference due to the driving circuit. For example, a surface of the over-coat layer 130 opposite to the device substrate 100 may be a flat surface. The thin film transistor 200 may be covered by the over-coat layer 130, completely.

The over-coat layer 130 may include an insulating material. The over-coat layer 130 may include a material different from the lower passivation layer 120. The over-coat layer 130 may include a material having relatively high fluid. For example, the over-coat layer 130 may include an organic material.

The over-coat layer 130 may include an electrode contact hole 130h partially exposing the drain electrode 260. The first electrode 310 may be electrically connected to the drain electrode 260 of the thin film transistor 200 through the electrode contact hole 130h. For example, the first electrode 310 may be in contact with the drain electrode 260 at the inside of the electrode contact hole 130h.

A bank insulating layer 140 covering an edge of the first electrode 310 may be disposed on the over-coat layer 130. The light-emitting layer 320 and the second electrode 330 may be sequentially stacked on a portion of the first electrode 310 which is exposed by the bank insulating layer 140. The bank insulating layer 140 may include an insulating material. For example, the bank insulating layer 140 may include an organic material. The bank insulating layer 140 may include a material different from the over-coat layer 130.

The second electrode 330 may extend on the bank insulating layer 140. For example, a side surface of the over-coat layer 130 disposed close to a side surface 100s of the device substrate 100 and a side surface of the bank insulating layer 140 may be covered by the second electrode 330. Thus, the display apparatus according to the aspect of the present disclosure may prevent that the moisture permeated from the outside moves into the light-emitting device 300 through the over-coat layer 130 and the bank insulating layer 140.

A color filter 400 may be disposed between the device substrate 100 and the light-emitting device 300. For example, the color filter 400 may be disposed between the lower passivation layer 120 and the over-coat layer 130. A thickness difference due to the color filer 400 may be removed by the over-coat layer 130. The light emitted from the light-emitting device 300 may emit outside through the color filter 400. The color filter 400 may change color realized by the light emitted from the light-emitting device 300. For example, the color filter 400 may display blue color, red color or green color using the light emitted from the light-emitting device 300 which displays white color.

The color filter 400 may overlap with a portion of the first electrode 310 exposed by the bank insulating layer 140. The color filter 400 may be not overlap with the thin film transistor 200. For example, the thin film transistor 200 may overlap with the bank insulating layer 140. A horizontal width of the color filter 400 may be larger than a horizontal width of the portion of the first electrode 310 exposed by the bank insulating layer 140. Thus, in the display apparatus according to the aspect of the present disclosure, the light emitted from the light-emitting device 300 must pass through the color filter 400. Therefore, in the display apparatus according to the aspect of the present disclosure, light-leakage may be prevented.

An encapsulating layer 500 may be disposed on the second electrode 330 of the light-emitting device 300. The encapsulating layer 500 may prevent the damage of the light-emitting device 300 due to the external impact and moisture. For example, the light-emitting device 300 may be covered by the encapsulating layer 500, completely. A side surface 500s of the encapsulating layer 500 may be disposed closer a side surface 100s of the device substrate 100 than the second electrode 330 of the light-emitting device 300. For example, the encapsulating layer 500 may include a region being in contact with the device substrate 100.

The encapsulating layer 500 may have a multi-layer structure. For example, the encapsulating layer 500 may include a lower encapsulating layer 510 and an upper encapsulating layer 520, which are sequentially stacked. The light-emitting device 300 may be covered by the lower encapsulating layer 510. Moisture-absorbing particles 500p having a moisture absorbing material may be dispersed in the upper encapsulating layer 520. Thus, in the display apparatus according to the aspect of the present disclosure, the stress applied to the light-emitting structure 300 due to the expansion of the moisture-absorbing particles 500p, may be relieved.

The encapsulating layer 500 may include an insulating material. The encapsulating layer 500 may include a material that does not require a curing process. For example, the encapsulating layer 500 may include an olefin based material. Thus, in the display apparatus according to the aspect of the present disclosure, the deterioration of the light-emitting device 300 due to a process of forming the encapsulating layer 500 may be prevented. The lower encapsulating layer 510 may include a material different from the upper encapsulating layer 520.

The display apparatus according to the aspect of the present disclosure is described that the encapsulating layer 500 is in contact with the light-emitting device 300. However, the display apparatus according to another aspect of the present disclosure may further include an upper passivation layer between the second electrode 330 of the light-emitting device 300 and the lower encapsulating layer 510. The upper passivation layer may prevent the damage of the light-emitting device 300 due to the external impact and moisture. The upper passivation layer may include an insulating material. The upper passivation layer may have a multi-layer structure. The upper passivation layer may include a material different from the encapsulating layer 500. For example, the upper passivation layer may have a structure in which an organic insulating layer formed of an organic material is disposed between inorganic insulating layers formed of an inorganic material. Thus, in the display apparatus according to another aspect of the present disclosure, the damage of the light-emitting device 300 due to the external impact and moisture may be prevented, efficiently.

An encapsulation substrate 600 may be disposed on the encapsulating layer 500. A size of the encapsulation substrate 600 may be larger than a size of the encapsulating layer 500. The size of the encapsulation substrate 600 may be smaller than a size of the device substrate 100. For example, a side surface 600s of the encapsulation substrate 600 may be disposed between the side surface 100s of the device substrate 100 and a side surface 500s of the encapsulating layer 500. A surface of an edge of the encapsulation substrate 600 toward the device substrate 100 may be not overlap with the encapsulating layer 500. Thus, in the display apparatus according to the aspect of the present disclosure, defects due to deformation of the encapsulating layer 500 occurring in the forming process may be prevented.

The encapsulation substrate 600 may include a material different from the device substrate 100. The encapsulation substrate 600 may provide a path for radiating heat which is generated by the light-emitting device 300 and/or the driving circuit in the operation of displaying an image. For example, the encapsulation substrate 600 may include a metal having relatively high thermal conductivity, such as aluminum (Al).

The encapsulation substrate 600 may include a plurality of penetrating holes 600h. The penetrating holes 600h may provide a space for thermal expansion of the encapsulation substrate 600. Thus, in the display apparatus according to the aspect of the present disclosure, the warpage of the encapsulation substrate 600 due to external heat may be prevented. Therefore, in the display apparatus according to the aspect of the present disclosure, defects due to the warpage of the encapsulation substrate 600 may be prevented.

A moisture-blocking layer 700 may be disposed between the encapsulating layer 500 and the encapsulation substrate 600. The water vapor transmission rate (WVTR) of the moisture-blocking layer 700 may be lower than the WVTR of the encapsulating layer 500. For example, the amount of moisture passing through the moisture-blocking layer may be less than the amount of moisture passing through the encapsulating layer of the same thickness during a certain period of time.

The moisture-blocking layer may be in directly contact with the encapsulating layer 500 and the encapsulation substrate 600. The penetrating holes 600h of the encapsulation substrate 600 may overlap with the moisture-blocking layer 700. For example, the penetrating holes 600h of the encapsulation substrate 600 may be covered by the moisture-blocking layer 700. Thus, in the display apparatus according to the aspect of the present disclosure, moisture permeating through the penetrating holes 600h of the encapsulation substrate 600 may be blocked by the moisture-blocking layer 700. Therefore, in the display apparatus according to the aspect of the present disclosure, the deterioration of the light-emitting device 300 due to the permeation of the external moisture may be minimized, and the warpage of the encapsulation substrate 600 due to the external heat may be prevented.

The moisture-blocking layer 700 may include an insulating material. The moisture-blocking layer 700 may include an organic material. The moisture-blocking layer 700 may include a material different from the encapsulation substrate 600. For example, the moisture-blocking layer 700 may include a synthetic resin, such as poly-ethylene terephthalate (PET).

A surface of the encapsulating layer 500 toward the encapsulation substrate 600 may be completely covered by the moisture-blocking layer 700. For example, a size of the moisture-blocking layer 700 may be the same as the size of the encapsulating layer 500. A side surface 700s of the moisture-blocking layer 700 may be vertically aligned with the side surface 500s of the encapsulating layer 500. Thus, in the display apparatus according to the aspect of the present disclosure, the permeation of the external moisture through the surface of the encapsulating layer 500 toward the encapsulation substrate 600 may be prevented.

The penetrating holes 600h of the encapsulation substrate 600 may be disposed at regular intervals. For example, the penetrating holes 600h may be disposed in a matrix form, as shown in FIG. 2. A first distance D1 between the penetrating holes 600h adjacent in a first direction X may be the same as a second distance D2 between the penetrating holes 600h adjacent in a second direction Y perpendicular to the first direction X. Thus, the display apparatus according to the aspect of the present disclosure may prevent the amount of permeating moisture from changing depending on the position.

In the display apparatus according to the aspect of the present disclosure, a third distance D3 between the side surface 600s of the encapsulation substrate 600 and the penetrating hole 600h disposed closest to the corresponding side surface 600s of the encapsulation substrate 600 may be larger than the first distance D1 and the second distance D2. For example, the third distance D3 may be equal to the sum of the distance Ds between the side surface 600s of the encapsulation substrate 600 and the side surface 500s of the encapsulating layer 500, and the first distance D1. Thus, the display apparatus according to the aspect of the present disclosure may prevent the amount of permeating the external moisture from increasing at the edge of the moisture-blocking layer 700.

Figure 3:
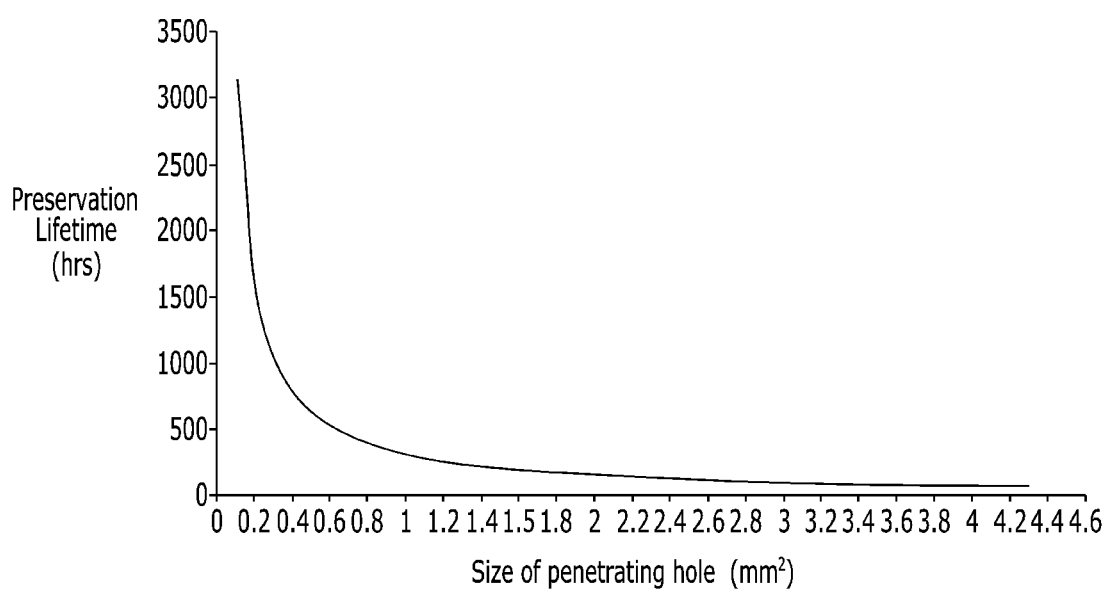
FIG. 3 is a graph showing preservation lifetime according to a size of a penetrating hole per unit area in the display apparatus according the present disclosure.

FIG. 3 is a graph showing preservation lifetime according to a size of a penetrating hole per unit area in the display apparatus according to the aspect of the present disclosure.

Referring to FIG. 3, it may be seen that the preservation lifetime is inversely proportional to the size of the penetrating hole 600h. And, when the size of the penetrating hole 600h is larger than 2 mm$^2$, the decreased in the preservation lifetime is greatly reduced. That is, when the size of the penetrating hole 600h exceeds 2 mm$^2$, the light-emitting device 300 may be completely deteriorated by moisture permeating through the penetrating hole 600h. Thus, in the display apparatus according to the aspect of the present disclosure, each of the penetrating holes 600h may have a size of 2 mm$^2$ or less per unit area for preventing the complete deterioration of the light-emitting device 300.

Figure 4:
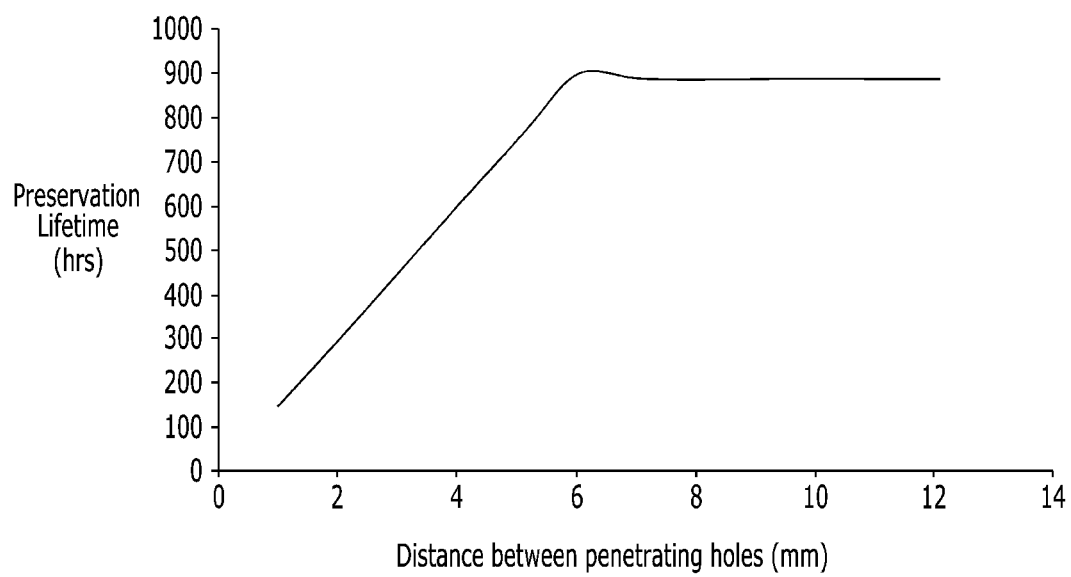
FIG. 4 is a graph showing preservation lifetime according to a distance between the penetrating holes in the display apparatus according to the present disclosure.

FIG. 4 is a graph showing preservation lifetime according to a distance between the penetrating holes in the display apparatus according to the aspect of the present disclosure.

Referring to FIG. 4, it may be seen that the preservation lifetime is proportional to the distance between the penetrating holes 600h, when the distance between the penetrating holes 600h is 6 mm or less. And, when the distance between the penetrating holes 600h is larger than 6 mm, the preservation lifetime does not changed, substantially. Thus, in the display apparatus according to the aspect of the present disclosure, the distance between the penetrating holes 600h in the first direction X and in the second direction Y perpendicular to the first direction X, may be larger than 6 mm for maximizing the preservation lifetime.

Accordingly, the display apparatus according to the aspect of the present disclosure may include the moisture-blocking layer 700 and the encapsulation substrate 600 which are sequentially disposed on the encapsulating layer 500 covering the light-emitting device 300. The water vapor transmission rate (WVTR) of the moisture-blocking layer 700 may be lower than the WVTR of the encapsulating layer 500. The encapsulation substrate 600 may include the penetrating holes 600h overlapping with the moisture-blocking layer 700. Thus, in the display apparatus according to the aspect of the present disclosure, the deterioration of the light-emitting device 300 due to the external moisture may be minimized, and the warpage of the encapsulation substrate 600 due to the external heat may be prevented. And, in the display apparatus according to the aspect of the present disclosure, each of the penetrating holes 600h may have a size of 2 min or less for minimizing difference in the amount of permeating moisture depending on the size difference of the penetrating holes. Also, in the display apparatus according to the aspect of the present disclosure, the distance between the penetrating holes 600h may be 6 mm or more for maximizing the preservation lifetime. Therefore, in the display apparatus according to the aspect of the present disclosure, lifetime may be improved.

The display apparatus according to the aspect of the present disclosure is described that the moisture-blocking layer 700 overlapping with the penetrating holes 600h of the encapsulation substrate 600 may include an insulating material. However, in the display apparatus according to another aspect of the present disclosure, the moisture-blocking layer 700 between the encapsulating layer 500 and the encapsulation substrate 600 may include a material having hardness larger than the encapsulation substrate 600. For example, in the display apparatus according to another aspect of the present disclosure, the moisture-blocking layer 700 may include a metal. In general, the rigidity of the metal having high thermal conductivity is lower, relatively. Thus, in the display apparatus according to another aspect of the present disclosure, the rigidity of the encapsulation substrate 600 may be complemented by the moisture-blocking layer 700. Therefore, in the display apparatus according to another aspect of the present disclosure, the damage of the light-emitting device 300 due to the external impact may be effectively prevented without lowering the heat radiation efficiency.

And, in the display apparatus according to another aspect of the present disclosure, the moisture-blocking layer 700 may include a ferromagnetic metal, such as iron (Fe), nickel (Ni) and cobalt (Co). Thus, in the display apparatus according to another aspect of the present disclosure, the encapsulation substrate 600 in which the moisture-blocking layer 700 is formed, may be moved by jig. That is, in the display apparatus according to another aspect of the present disclosure, the position adjustment of the encapsulation substrate 600 may be easy in a process of coupling the device substrate 100 and the encapsulation substrate 600. Therefore, in the display apparatus according to another aspect of the present disclosure, the process efficiency may be improved without lowering the heat radiation efficiency.

Figure 5:
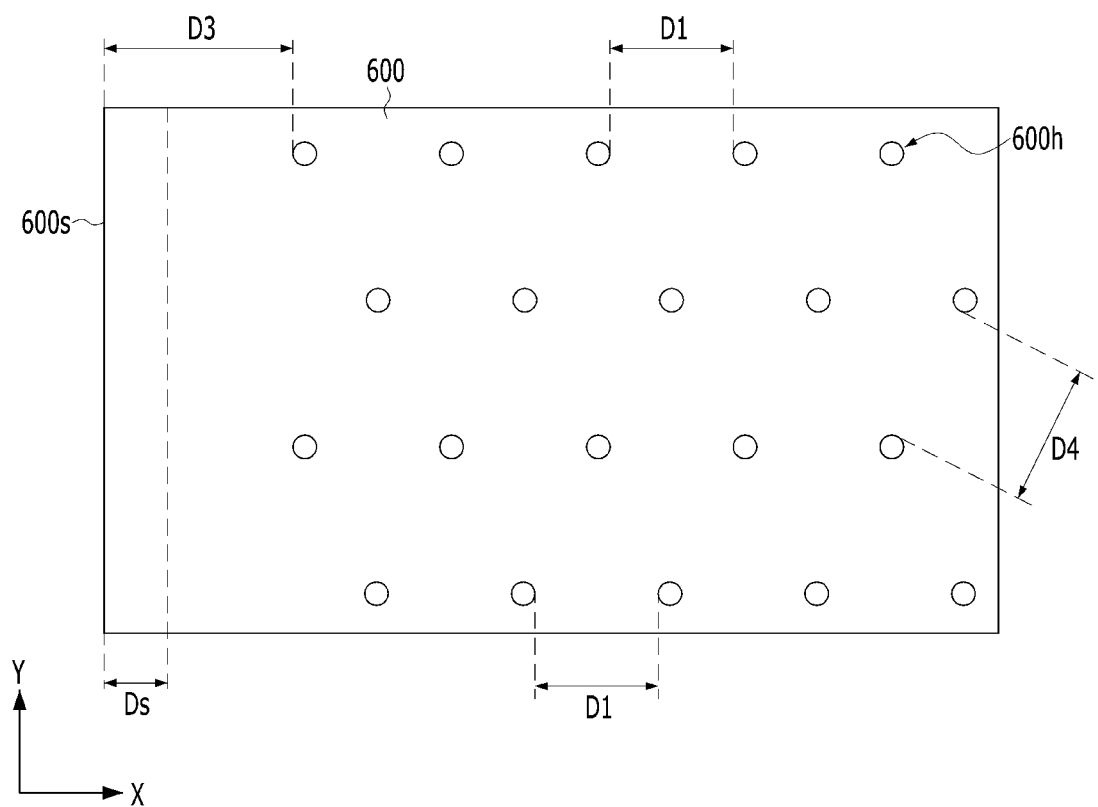
FIGS. 5 to 7 are views respectively showing the display apparatus according to another aspect of the present disclosure.

The display apparatus according to the aspect of the present disclosure is described that the penetrating holes 600h of the encapsulation substrate 600 may be disposed in a matrix form. However, in the display apparatus according to another aspect of the present disclosure, the penetrating holes 600h may have a constant distance in the first direction X, and may be staggered in the second direction Y perpendicular to the first direction X, as shown in FIG. 5. A fourth distance D4 between the penetrating holes 600h which are staggered may be larger than the first distance D1 between the penetrating holes 600h in the first direction X. For example, the fourth distance D4 between the penetrating holes 600h which are staggered may be 6 mm or more. Thus, in the display apparatus according to another aspect of the present disclosure, the degree of freedom in arrangement of the penetrating holes 600h may be improved.

Figure 6:
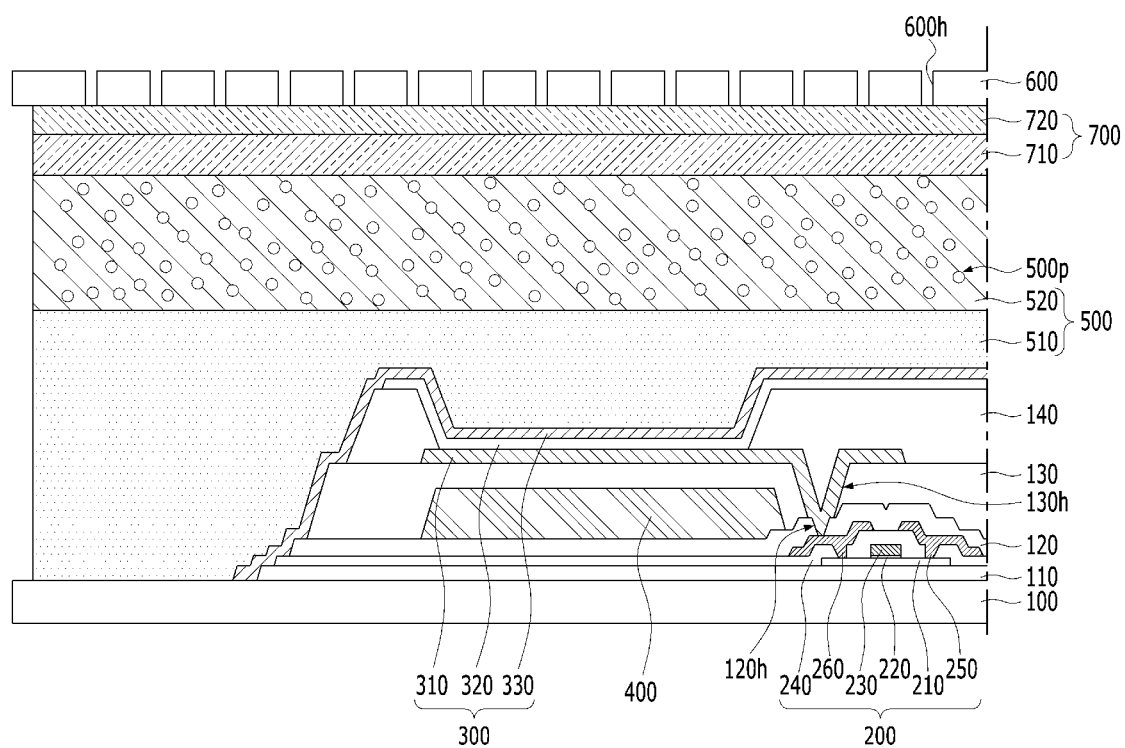

The display apparatus according to the aspect of the present disclosure is described that the moisture-blocking layer 700 may be single layer. However, in the display apparatus according to another aspect of the present disclosure, the moisture-blocking layer 700 may have a multi-layer structure. For example, in the display apparatus according to another aspect of the present disclosure, a first moisture-blocking layer 710 and a second moisture-blocking layer 720 may be stacked between the encapsulating layer 500 and the encapsulation substrate 600, as shown in FIG. 6. The second moisture-blocking layer 720 may be disposed between the first moisture-blocking layer 710 and the encapsulation substrate 600. The penetrating holes 600h of the encapsulation substrate 600 may be covered by the second moisture-blocking layer 720.

The second moisture-blocking layer 720 may include a material different from the first moisture-blocking layer 710. For example, in the display apparatus according to another aspect of the present disclosure, the first moisture-blocking layer 710 including an organic insulating material, and the second moisture-blocking layer 720 including an inorganic insulating material may be stacked. The first moisture-blocking layer 710 and the second moisture-blocking layer 720 may have the water vapor transmission rate (WVTR) lower than the encapsulating layer 500. For example, the first moisture-blocking layer 710 may include poly-ethylene terephthalate (PET), and the second moisture-blocking layer 720 may include silicon nitride. Thus, in the display apparatus according to another aspect of the present disclosure, the moisture-blocking layer 710 and 720 may be formed thick enough for blocking moisture which permeates through the penetrating holes 600h. And, in the display apparatus according to another aspect of the present disclosure, the generation of seam may be prevented in a process of depositing the moisture-blocking layer 710 and 720. Thus, in the display apparatus according to another aspect of the present disclosure, the permeation of moisture through the penetrating holes 600h of the encapsulation substrate 600 may be efficiently prevented.

Figure 7:
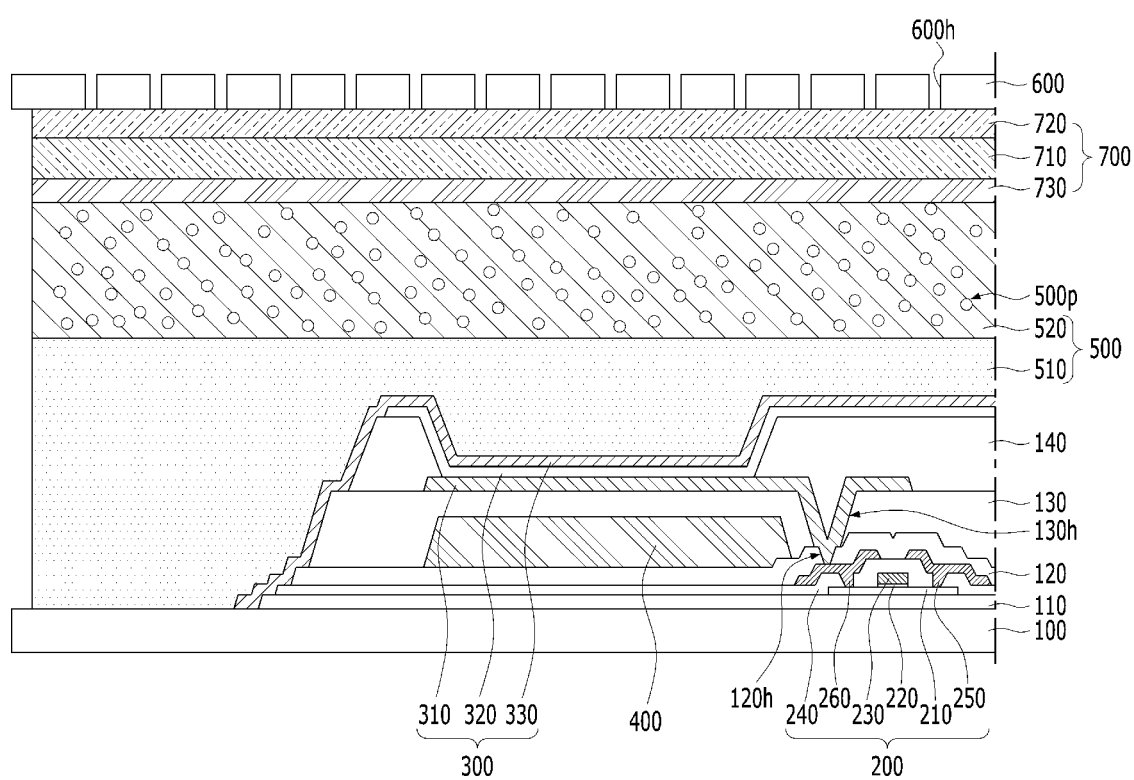

The display apparatus according to another aspect of the present disclosure is described that the moisture-blocking layer 710 and 720 disposed between the encapsulating layer 500 and the encapsulation substrate 600 may be formed of an insulating material. However, in the display apparatus according to further another aspect of the present disclosure, the moisture-blocking layer formed of an insulating material, and the moisture-blocking layer formed of a conductive material may be stacked between the encapsulating layer 500 and the encapsulation substrate 600. For example, in the display apparatus according to further another aspect of the present disclosure, a third moisture-blocking layer 730 including a metal may be disposed between the encapsulating layer 500 and the first moisture-blocking layer 710 including an insulating material, as shown in FIG. 7. The first moisture-blocking layer 710 may be disposed between the third moisture-blocking layer 730 and the second moisture-blocking layer 720 including an insulating material. The third moisture-blocking layer 730 may include a magnetic material, such as iron (Fe), nickel (Ni) and cobalt (Co). Thus, in the display apparatus according to further another aspect of the present disclosure, the rigidity of the encapsulation substrate 600 may be complemented, the deterioration of the light-emitting device 300 due to the permeation of the external moisture may be minimized, and the warpage of the encapsulation substrate 600 due to the external heat may be prevented without lowering the heat radiation efficiency. And, in the display apparatus according to further another aspect of the present disclosure, the moisture-blocking layer 710 and 720 including an insulating material may be disposed between the third moisture-blocking layer 730 including a metal, and the encapsulation substrate 600 including the penetrating holes 600h, so that the corrosion of the third moisture-blocking layer 730 due to the moisture permeating through the penetrating holes 600h may be prevented. Thus, in the display apparatus according to further another aspect of the present disclosure, the degree of freedom in the material of the third moisture-blocking layer 730 and the process efficiency may be improved.

In the result, the display apparatus according to the aspects of the present disclosure may include the encapsulation substrate on the encapsulating layer covering the light-emitting device, and the moisture-blocking layer between the encapsulating layer and the encapsulation substrate. The encapsulation substrate may include the penetrating holes overlapping with the moisture-blocking layer. The moisture-blocking layer may have the water vapor transmission rate (WVTR) lower than the encapsulating layer. Thus, in the display apparatus according to the aspects of the present disclosure, the deterioration of the light-emitting device due to the permeation of the external moisture may be minimized, and the warpage of the encapsulation substrate due to the external heat may be prevented. Therefore, in the display apparatus according to the aspects of the present disclosure, the lifetime may be improved.

What is claimed is:

1. A display apparatus comprising:
a light-emitting device on an upper surface of a device substrate, a lower surface of the device substrate opposite to the upper surface being an emission surface of the display apparatus that light generated by the light-emitting device is emitted;
a color filter between the device substrate and the light-emitting device, the color filter overlapping with the light-emitting device;
a thin film transistor on the upper surface of the device substrate, the thin film transistor electrically connected to the light-emitting device and disposed outside the light-emitting device;

an encapsulating layer on the upper surface of the device substrate and covering the light-emitting device and the thin film transistor, an upper surface of the encapsulating layer opposite to the device substrate being a non-emission surface of the display apparatus;

an encapsulation substrate on the upper surface of the encapsulating layer and including metal having high thermal conductivity for radiating the heat to outside of the display apparatus and a plurality of penetrating holes penetrating the encapsulation substrate overlapping with the light-emitting device that provides a space for thermal expansion of the encapsulation substrate; and a first moisture-blocking layer between the encapsulating layer and the encapsulation substrate, wherein the first moisture-blocking layer has a water vapor transmission rate lower than that of the encapsulating layer, wherein the encapsulation substrate includes a portion overlapping with the light-emitting device, and wherein a distance between the penetrating holes is larger than 6 mm.

2. The display apparatus according to claim 1, wherein the encapsulation substrate includes aluminum (Al).

3. The display apparatus according to claim 1, wherein the first moisture-blocking layer and the encapsulating layer include an organic insulating material.

4. The display apparatus according to claim 3, further comprising moisture-absorbing particles dispersed in the encapsulating layer, wherein the moisture-absorbing particles include a moisture-absorbing material.

5. The display apparatus according to claim 3, further comprising a second moisture-blocking layer between the first moisture-blocking layer and the encapsulation substrate, wherein the second moisture-blocking layer includes an inorganic insulating material.

6. The display apparatus according to claim 1, wherein each of the penetrating holes has a dimension equal to or less than 2 mm².

7. The display apparatus according to claim 1, wherein each of the penetrating holes is disposed at a regular interval.

8. The display apparatus according to claim 1, wherein the first moisture blocking layer is a single layer being in contact with the encapsulating layer and the encapsulation substrate.

9. The display apparatus according to claim 7, wherein a side surface of the encapsulation substrate is disposed between a side surface of the device substrate and a side surface of the first moisture-blocking layer, and wherein a distance between the penetrating holes is smaller than a distance between the side surface of the encapsulation substrate and closest penetrating holes to the side surface of the encapsulation substrate.

10. The display apparatus according to claim 9, wherein a distance between closest penetrating holes to the side surface of the encapsulation substrate and the side surface of the first moisture-blocking layer is same as a distance between the penetrating holes.

11. A display apparatus comprising:

an encapsulation substrate on a device substrate, the encapsulation substrate including metal;

an encapsulating layer disposed between the device substrate and the encapsulation substrate, and including moisture-absorbing particles;

a thin film transistor disposed between the device substrate and the encapsulating layer;

a light-emitting device disposed between the device substrate and the encapsulating layer, the light-emitting device electrically connected to the thin film transistor and disposed outside the thin film transistor;

a color filter disposed between the device substrate and the light-emitting device, the color filter overlapping with the light-emitting device; and a first moisture-blocking layer disposed between the encapsulating layer and the encapsulation substrate, a water vapor transmission rate of the first moisture-blocking layer being lower than that of the encapsulating layer, wherein a lower surface of the device substrate opposite to the encapsulation substrate is an emission surface of the display apparatus that light generated by the light-emitting device is emitted, and an upper surface of the encapsulating layer opposite to the device substrate is a non-emission surface of the display apparatus, wherein the encapsulation substrate includes a plurality of penetrating holes overlapping with the first moisture-blocking layer and the light-emitting device that provides a space for expansion of the encapsulation substrate due to heat by the operation of the thin film transistor and the light-emitting device, wherein the encapsulation substrate includes a portion overlapping with the light-emitting device, and wherein a distance between the penetrating holes is larger than 6 mm.

12. The display apparatus according to claim 11, wherein the plurality of the penetrating holes is disposed at a regular interval in a first direction, and wherein the plurality of the penetrating holes is staggered in a second direction perpendicular to the first direction.

13. The display apparatus according to claim 11, wherein the first moisture-blocking layer includes a magnetic material.

14. The display apparatus according to claim 13, wherein the magnetic material is one of iron (Fe), nickel (Ni) and cobalt (Co).

15. The display apparatus according to claim 13, further comprising a second moisture-blocking layer between the first moisture-blocking layer and the encapsulation substrate, wherein the second moisture-blocking layer includes an insulating material having the water vapor transmission rate lower than that of the encapsulating layer.

16. A display apparatus comprising:

a light-emitting device on an upper surface of a device substrate, a lower surface of the device substrate opposite to the upper surface being an emission surface of the display apparatus that light generated by the light-emitting device is emitted;

a color filter between the device substrate and the light-emitting device, the color filter overlapping with the light-emitting device;

a thin film transistor on the upper surface of the device substrate, the thin film transistor electrically connected to the light-emitting device and disposed outside the light-emitting device;

an encapsulating layer on the upper surface of the device substrate and covering the light-emitting device and the thin film transistor, an upper surface of the encapsulating layer opposite to the device substrate being a non-emission surface of the display apparatus;

an encapsulation substrate on the upper surface of the encapsulating layer and including metal having high thermal conductivity for radiating the heat to outside of the display apparatus and having a plurality of penetrating holes overlapping with the light-emitting device that provides a space for thermal expansion of the encapsulation substrate, the plurality of the penetrating holes disposed at a regular interval penetrating the encapsulation substrate; and a moisture-blocking layer between the encapsulating layer and the encapsulation substrate and including a plurality of moisture-absorbing particles dispersed in the encapsulating layer, wherein the moisture-blocking layer has a water vapor transmission rate lower than that of the encapsulating layer, wherein the encapsulation substrate includes a portion overlapping with the light-emitting device, and wherein a distance between the penetrating holes is larger than 6 mm.

17. The display apparatus according to claim 16, wherein the moisture-blocking layer comprises a first moisture-blocking layer disposed on the encapsulating layer and a second moisture-blocking layer between the first moisture-blocking layer and the encapsulation substrate.

18. The display apparatus according to claim 16, wherein the moisture-blocking layer comprises a first moisture-blocking layer and a second moisture-blocking layer between the encapsulating layer and the encapsulating substrate and a third moisture-blocking layer between the first and second moisture-blocking layers and the encapsulating layer.

19. The display apparatus according to claim 18, wherein the first and the second moisture-blocking layers include an insulating material and the third moisture-blocking layer includes a metallic material.

20. The display apparatus according to claim 16, wherein the encapsulating layer comprises first and second encapsulating layers, and wherein the first encapsulating layer covers the light-emitting device and the plurality of moisture-absorbing particles is dispersed in the second encapsulating layer.

* * * * *